(12) United States Patent
Matsumoto et al.

(10) Patent No.: US 7,586,390 B2
(45) Date of Patent: Sep. 8, 2009

(54) BULK ACOUSTIC WAVE RESONATOR, BULK ACOUSTIC WAVE FILTER, RF MODULE INCLUDING BULK ACOUSTIC WAVE RESONATOR AND/OR FILTER, AND BULK ACOUSTIC WAVE OSCILLATOR

(75) Inventors: Hisanori Matsumoto, Kokubunji (JP); Tomio Iwasaki, Tsukoba (JP); Kengo Asai, Hachioji (JP); Nobuhiko Shibagaki, Kokubunju (JP)

(73) Assignee: Hitachi Media Electronics Co., Ltd., Iwate-ken (JP)

( * ) Notice: Subject to any disclaimer, the term of this patent is extended or adjusted under 35 U.S.C. 154(b) by 275 days.

(21) Appl. No.: 11/345,538

(22) Filed: Feb. 2, 2006

(65) Prior Publication Data
US 2006/0267710 A1 Nov. 30, 2006

(30) Foreign Application Priority Data
May 30, 2005 (JP) ............................. 2005-156573

(51) Int. Cl.
*H03H 9/15* (2006.01)
*H03H 9/54* (2006.01)
*H03H 9/13* (2006.01)

(52) U.S. Cl. ...................... 333/187; 333/189; 310/363; 310/364

(58) Field of Classification Search ................. 333/187, 333/189; 310/363, 364
See application file for complete search history.

(56) References Cited

U.S. PATENT DOCUMENTS
6,472,954 B1 * 10/2002 Ruby et al. ................. 333/133
(Continued)

FOREIGN PATENT DOCUMENTS
EP          1124328          8/2001
(Continued)

OTHER PUBLICATIONS

G.F. Iriarte et al.; "Synthesis of C-Axis Oriented AlN Thin Film on Metal Layers: Al, Mo, Ti, TiN and Ni"; 2002 IEEE Ultrasonics Symposium; vol. 1, pp. 311-315, Oct,. 8-11, 2002.*

*Primary Examiner*—Barbara Summons
(74) *Attorney, Agent, or Firm*—Antonelli, Terry, Stout & Kraus, LLP.

(57) ABSTRACT

A bulk acoustic wave resonator which has excellent elasticity and high electromechanical energy conversion efficiency. A bulk acoustic wave resonator comprises a substrate, a lower electrode formed on the substrate, an interlayer formed on the lower electrode layer, a piezoelectric layer formed on the interlayer, and an upper electrode layer formed on the piezoelectric layer. Moreover, both the first lattice mismatch, which is determined between a short edge of the lattice constituting a closest packed plane of a material consisting of an interlayer and a short edge of the lattice constituting a closest packed plane of a material consisting of a piezoelectric layer, and the second lattice mismatch, which is determined between a long edge of the lattice constituting a closest packed plane of a material consisting of an interlayer and a long edge of the lattice constituting a closest packed plane of a material consisting of the piezoelectric layer, are 7% or less, and a lower electrode layer is a material in which the value of the elastic stiffness $C_{33}$ is 300 $GN/m^2$ or more.

15 Claims, 10 Drawing Sheets

U.S. PATENT DOCUMENTS 6,936,837 B2 * 8/2005 Yamada et al. .................. 257/2
7,240,410 B2 * 7/2007 Yamada et al. ............. 29/25.35
7,276,994 B2 * 10/2007 Takeuchi et al. ............ 333/189
7,323,805 B2 * 1/2008 Sano et al. .................. 310/358

FOREIGN PATENT DOCUMENTS

JP  2001-274650  10/2001

* cited by examiner

BULK ACOUSTIC WAVE RESONATOR, BULK ACOUSTIC WAVE FILTER, RF MODULE INCLUDING BULK ACOUSTIC WAVE RESONATOR AND/OR FILTER, AND BULK ACOUSTIC WAVE OSCILLATOR

CLAIM OF PRIORITY

The present application claims priority from Japanese application JP 2005-156573 filed on May 30, 2005, the content of which is hereby incorporated by reference into this application.

FIELD OF THE INVENTION

The present invention is related to a resonator and specifically to a bulk acoustic wave resonator (hereinafter called a "BAW resonator") using a bulk acoustic wave (hereinafter called a "BAW"), a filter using a bulk acoustic wave resonator (hereinafter called a "BAW resonator filter"), an RF module using a bulk acoustic wave resonator filter, and a standard frequency oscillator using a bulk acoustic wave resonator.

BACKGROUND OF THE INVENTION

A BAW resonator is able to accommodate a high frequency, from about several hundred megahertz to more than ten gigahertz, and, as an example, it is used to construct an RF filter for portable telephones, etc. The BAW resonator has a base structure in which the piezoelectric layer is sandwiched from the top and bottom by an upper electrode layer and a lower electrode layer. The BAW resonator functions as a resonator in an electric circuit by applying an alternating voltage between the upper and the lower electrodes to excite the piezoelectric layer.

There is a resonator such as a BAW resonator, in which an electrode including a nucleation promotion layer having the effect of promoting crystallization of the piezoelectric layer is applied to the lower electrode (refer to, for instance, JP-A, No. 274650/2001). In the same document, platinum (Pt), gold (Au), rhodium (Rh), palladium (Pd), silver (Ag), and iridium (Ir) are described as a concrete material of a lower electrode including a nucleation promotion layer.

Moreover, in FIG. 3A of the same document there is disclosed a resonator in which a textured film having the effect of promoting crystallization of a piezoelectric layer is formed on the lower electrode and a piezoelectric layer is formed thereon, and aluminum (Al) and Pt are described as concrete materials for the lower electrode and the textured film, respectively.

Furthermore, as another resonator, in FIG. 3B of the same document there is disclosed a resonator in which a textured film having the effect of promoting crystallization of a piezoelectric layer is formed on an adhesive electrode layer and a piezoelectric layer is formed thereon, and titanium (Ti), chromium (Cr), zirconium (Zr), hafnium (Hf), vanadium (V), niobium (Nb), tantalum (Ta), molybdenum (Mo), and tungsten (W) are described as concrete materials for the adhesive electrode layer.

SUMMERY OF THE INVENTION

A bulk acoustic wave in a BAW resonator is excited by applying an electric signal between the two electrodes separated by a piezoelectric layer. That is, a BAW resonator is an apparatus in which electric energy is converted to mechanical energy. In order to show the electromechanical energy conversion efficiency of the resonator, an electromechanical coupling coefficient (k) is generally used. A resonance/anti-resonance method is broadly used for estimating the k of a resonator, and, for instance, the k for a vibrational mode in the direction parallel to the electric field direction can be obtained by using the following equations 1.

$$k^2=(\pi/2)\cdot(f_r/f_a)\tan[(\pi/2)\cdot(f_a-f_r)/f_a] \quad \text{(equation 1)}$$

Herein, $f_r$ and $f_a$ are the resonance frequencies and the anti-resonance frequencies of the resonator, respectively. That is, when the k of the resonator becomes greater, the difference between the resonance frequency and the anti-resonance frequency also becomes greater. Since the difference between the resonance frequency and the anti-resonance frequency corresponds to the maximum band width which can be achieved when a filter consists of the resonator, a BAW resonator which has excellent electromechanical energy conversion efficiency is required to obtain a wide band filter. A dominant factor which determines the electromechanical energy conversion efficiency of a BAW resonator is the crystal orientation of the piezoelectric material. Forming a piezoelectric layer having excellent crystal orientation is one of the important conditions to obtain a high performance BAW resonator.

On the other hand, the attenuation of a BAW propagating in a medium strongly depends on the hardness of the material of the medium, and the harder the material, the smaller the attenuation. In order to quantify the hardness of various materials, the elastic stiffness is widely used. The elastic stiffness is defined as the value of stress which is necessary to make the material create a certain amount of strain, and it can be assumed that a material having a greater elastic stiffness has a greater hardness. Therefore, in order to obtain a BAW resonator having a high Q value, it is necessary to use one which has a high elastic stiffness value for the material of the electrode layer.

However, in the case when thin films composed of different materials are stacked, the lattice mismatch of these materials significantly influences the crystal orientation in layers deposited later. The lattice mismatch is a value which indicates the degree of mismatch of lattices of different materials. In the case when thin films composed of different materials are stacked on top of a material, the greater the lattice mismatch of both materials, the worse is the orientation of the stacked material. FIG. 2 shows the results where the lattice mismatch was studied between the aluminum nitride frequently used for a material of a piezoelectric layer of a BAW resonator and various metals which can be used for a material of an electrode layer. The lattice mismatches A and B in FIG. 2 are the ones calculated by using the following equations 2 and 3 when the short edges a and the long edges b of the lattices in the closest packed plane 37 of AlN and in the closest packed plane 38 of various metals are defined as shown in FIG. 11. Herein, the closest packed plane means a plane which has the largest number of atoms per unit area. For instance, the closest packed plane is the (111) plane in the case of a face centered cubic lattice, the (110) plane in the case of a body centered cubic lattice, and the (0001) plane in the case of a hexagonal close-packed structure. Moreover, the short edge and the long edge of the lattice are the adjacent two edges of a rectangular lattice which has one atom at the center of a rectangle as the lattice 39 in FIG. 11.

$$A=|a_A-a_M|/a_A\times 100 \quad \text{(equation 2)}$$

$$B=|b_A-b_M|/b_A\times 100\times a_A/b_A \quad \text{(equation 3)}$$

Herein, $a_A$ and $b_A$ are the short edge and the long edge of an AlN lattice, and $a_M$ and $b_M$ are the short edge and the long edge of a lattice of a metal. In equation 3, $a_A/b_A$ is multiplied in order to normalize it. A metallic material can be considered to be suitable for obtaining an AlN which has excellent orientation to the extent that both the lattice mismatch A in the direction of short edge of the lattice and the lattice mismatch B in the direction of long edge of the lattice approach 0. Although a and b were defined as the short edge and the long edge in the equations 2 and 3, a material in which a and b are the same is also included.

As a result of having studied the technologies disclosed in JP-A No. 274650/2001, the inventors discovered the following problems.

In JP-A No. 274650/2001, Pt, Ph, Pd, and Ir are recommended as a material for the lower electrode which includes a nucleation promotion layer, but, according to FIG. 2 in the present invention, they are not suitable as a material which promotes crystallization of AlN because these materials have a relatively larger lattice mismatch with respect to AlN. Moreover, according to FIG. 2, Au and Ag which are recommended, in addition to the aforementioned materials, as a material for the lower electrode which includes a nucleation promotion layer have a relatively small lattice mismatch with respect to AlN, but there is the disadvantage that the absorption of the BAW energy by the viscosity is large. That is, since Au and Ag have small values of the elastic stiffness, the attenuation of BAW is large, so that it causes a deterioration of the Q value of a resonator when they are used for a material of the electrode layer.

Moreover, since the elasticity of Al which is recommended in the same document as a material for the lower electrode is not that good either, Al is not desirable as a material for the electrode layer. Furthermore, according to FIG. 2, since Pt which is recommended in the same document as a material for the textured layer has a relatively larger lattice mismatch with respect to AlN, it is not suitable as a material to promote crystallization of AlN when AlN is continuously formed on top of Pt.

Moreover, although titanium (Ti), chromium (Cr), zirconium (Zr), hafnium (Hf), vanadium (V), niobium (Nb), tantalum (Ta), molybdenum (Mo), and tungsten (W) are mentioned as an adhesive electrode layer in the same document, there is no description of a concrete material for a textured layer formed on these adhesive electrode layers.

In order to obtain a BAW resonator having a high Q value, one which is a hard material, that is, which has a high elastic stiffness and has excellent elasticity is required as a material for the electrode. Additionally, in order to obtain a BAW resonator having a high electromechanical energy conversion efficiency, it is necessary to form a highly oriented piezoelectric layer, therefore, it is desirable that the lattice mismatch between the piezoelectric layer and the lower layer thereof be small. However, when only a material having excellent elasticity is used as the lower electrode layer, there is a possibility that the orientation of the piezoelectric layer is deteriorated because of the lattice mismatch between the lower electrode layer material and the piezoelectric layer material.

In this specification, excellent elasticity means that absorption of the BAW energy is small and bad elasticity means that absorption of the BAW energy is large.

A BAW resonator of the present invention comprises a substrate, a first electrode formed over one face of the substrate, a first layer formed over the first electrode layer, a piezoelectric layer formed over the first layer, and a second electrode layer formed over the piezoelectric layer, wherein both the first lattice mismatch, which is determined between a short edge of the lattice constituting a closest packed plane of a material consisting of the first layer and a short edge of the lattice constituting a closest packed plane of a material consisting of the piezoelectric layer, and the second lattice mismatch, which is determined between a long edge of the lattice constituting a closest packed plane of a material consisting of the first layer and a long edge of the lattice constituting a closest packed plane of a material consisting of the piezoelectric layer, are 7% or less, and the value of the elastic stiffness $C_{33}$ of a material constituting the first electrode layer is 300 $GN/m^2$ or more. Herein, the elastic stiffness $C_{33}$ means the proportional coefficient between a normal stress and the extensional strain in the z-direction of the crystal axis.

Moreover, a BAW resonator of the present invention comprises a substrate, a first electrode formed over one face of the substrate, a first layer formed over the first electrode layer, a piezoelectric layer formed over the first layer, and a second electrode layer formed over the piezoelectric layer, wherein the piezoelectric layer includes aluminum nitride, the first layer at least one of Ti and TiN, and the first electrode layer at least one of tungsten and molybdenum.

A bulk acoustic wave resonator filter of the present invention has a plurality of bulk acoustic wave resonators formed over a single substrate and both an input terminal and an output terminal which are mutually connected through the plurality of bulk acoustic wave resonators, wherein at least one of said plurality of bulk acoustic wave resonators comprises a first electrode formed over one face of the substrate, a first layer formed over the first electrode layer, a piezoelectric layer formed over the first layer, and a second electrode layer formed over the piezoelectric layer. Both the first lattice mismatch, which is determined between a short edge of the lattice constituting a closest packed plane of a material consisting of the first layer and a short edge of the lattice constituting a closest packed plane of a material consisting of the piezoelectric layer, and the second lattice mismatch, which is determined between a long edge of the lattice constituting a closest packed plane of a material consisting of the first layer and a long edge of the lattice constituting a closest packed plane of a material consisting of the piezoelectric layer, are 7% or less, and the value of the elastic stiffness $C_{33}$ of a material constituting the first electrode layer is 300 $GN/m^2$ or more.

An RF module of the present invention comprises a first terminal, a first bulk acoustic wave resonator filter in which the input terminal is connected to the first terminal, a second bulk acoustic wave resonator filter in which the output terminal is connected to the first terminal, a second terminal connected to the output terminal of said first bulk acoustic wave resonator filter, and a third terminal connected to the input terminal of the second bulk acoustic wave resonator filter, wherein at least one of the first and said second bulk acoustic wave resonator filters comprises a substrate, a first electrode layer formed over one face of the substrate, a first layer formed over the first electrode layer, a piezoelectric layer formed over the first layer, and a second electrode layer formed over the piezoelectric layer. Both the first lattice mismatch, which is determined between a short edge of the lattice constituting a closest packed plane of a material consisting of the first layer and a short edge of the lattice constituting a closest packed plane of a material consisting of the piezoelectric layer, and the second lattice mismatch, which is determined between a long edge of the lattice constituting a closest packed plane of a material consisting of the first layer and a long edge of the lattice constituting a closest packed plane of a material consisting of the piezoelectric layer, are 7% or less, and the value of the elastic stiffness $C_{33}$ of a material constituting said first electrode layer is 300 GN/m² or more.

According to the present invention, a BAW resonator can be formed having an excellent Q value and excellent electromechanical energy conversion efficiency.

DETAILED DESCRIPTION OF THE PREFERRED EMBODIMENTS

Embodiments of the present invention will be described hereinafter using concrete embodiments in reference to the accompanying drawings.

First Embodiment

Figure 1:
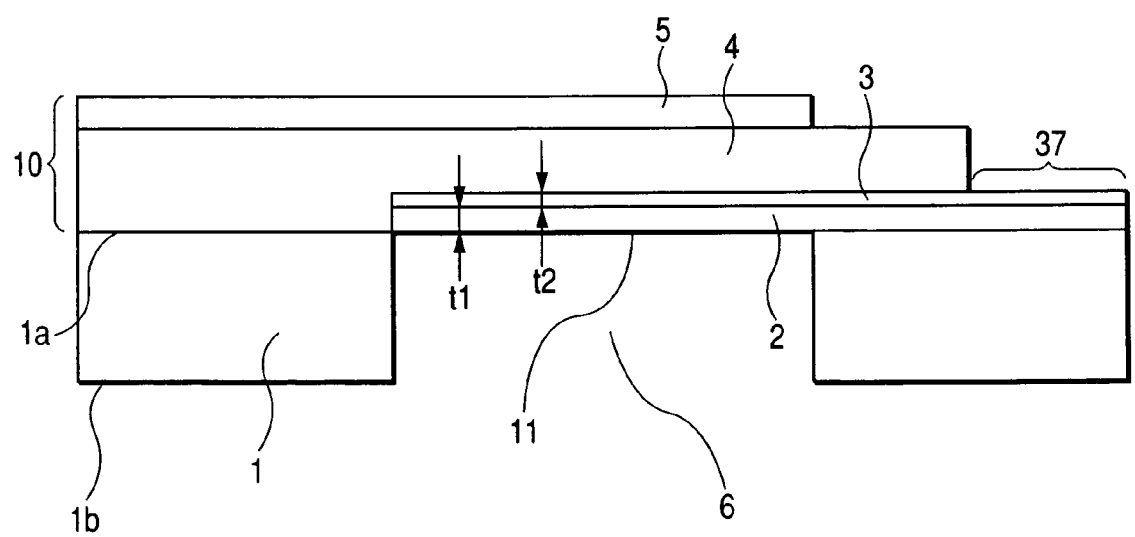
FIG. 1 is a cross-sectional structural drawing illustrating an embodiment of a BAW resonator of the present invention.

FIG. 1 is a cross-sectional structural drawing illustrating an embodiment of a BAW resonator of the present invention. A substrate 1 has a first face 1a and a second face 1b opposite the first face, and on the first face 1a of the substrate 1 a stack resonator 10 is mounted, in which a lower electrode layer 2, an interlayer 3, a piezoelectric layer 4, and an upper electric layer 5 are included. In this embodiment, the lower electrode layer 2 is formed on the first face 1a of the substrate 1, the interlayer 3 on the lower electrode layer 2, the piezoelectric layer 4 on the interlayer 3, and the upper electrode layer 5 on the piezoelectric layer 4. The stack resonator 10 is formed on a cavity 6 formed in the substrate 1. The cavity 6 has an opening 11 which is open on the first face 1a of the substrate 1, and the stack resonator 10 is formed covering this opening 11. In this embodiment, although the lower electrode layer 2 is formed covering the whole area of the opening 11 as seen from the direction being stacked against the first face 1a of the substrate 1, the lower electrode layer 2 may have a region which does not overlap the opening 11 as seen from this stacking direction and it is not intended to be limited to this embodiment. The cavity 6 is formed for the purpose of preventing radiation of the acoustic energy which is generated by excitation of the piezoelectric layer 4 to the substrate 1, and it can be formed by general techniques in a semiconductor manufacturing process, such as dry-etching and wet-etching, etc. from the second face 1b of the substrate 1. Or, it can be formed by using a process in which a sacrificial layer is formed on the first face 1a of the substrate 1, the stack resonator 10 being formed thereon, and then the sacrificial layer being removed.

The lower electrode layer 2 is composed of a material which has a value of the elastic stiffness $C_{33}$ being 300 GN/m² or more. Moreover, a material is used for the interlayer 3, in which both of the lattice mismatches of the short edge and the long edge of the lattice at the closest packed plane of the material constituting the piezoelectric layer 4 formed later are 7% or less. Herein, the elastic stiffness $C_{33}$ is the matrix element $C_{33}$ of the elastic stiffness and it represents the proportional coefficient between a normal stress and the extensional strain in the z-direction of the crystal axis. There is the effect that the filter properties required by a wide band wireless communication system which enables high-speed large capacity communication can be satisfied by using such a material for the lower electrode layer and the interlayer. A filter for wide band wireless communication requires not only improving the Q value relating to the steepness of the frequency passband width, but also making the frequency passband width wider. However, if a BAW resonator of this embodiment is used, a filter can be achieved which satisfies both the Q value and the band width required for a filter used in wide band wireless communication. As a wide band wireless communication system, for instance, the filter properties for a W-CDMA (Wideband Code Division Multiple Access) in a PCS (Personal Communications Services) frequency band of a portable phone can be satisfied. Moreover, it can be applied not only to a portable phone but also to a filter for wireless LAN.

Figure 2:
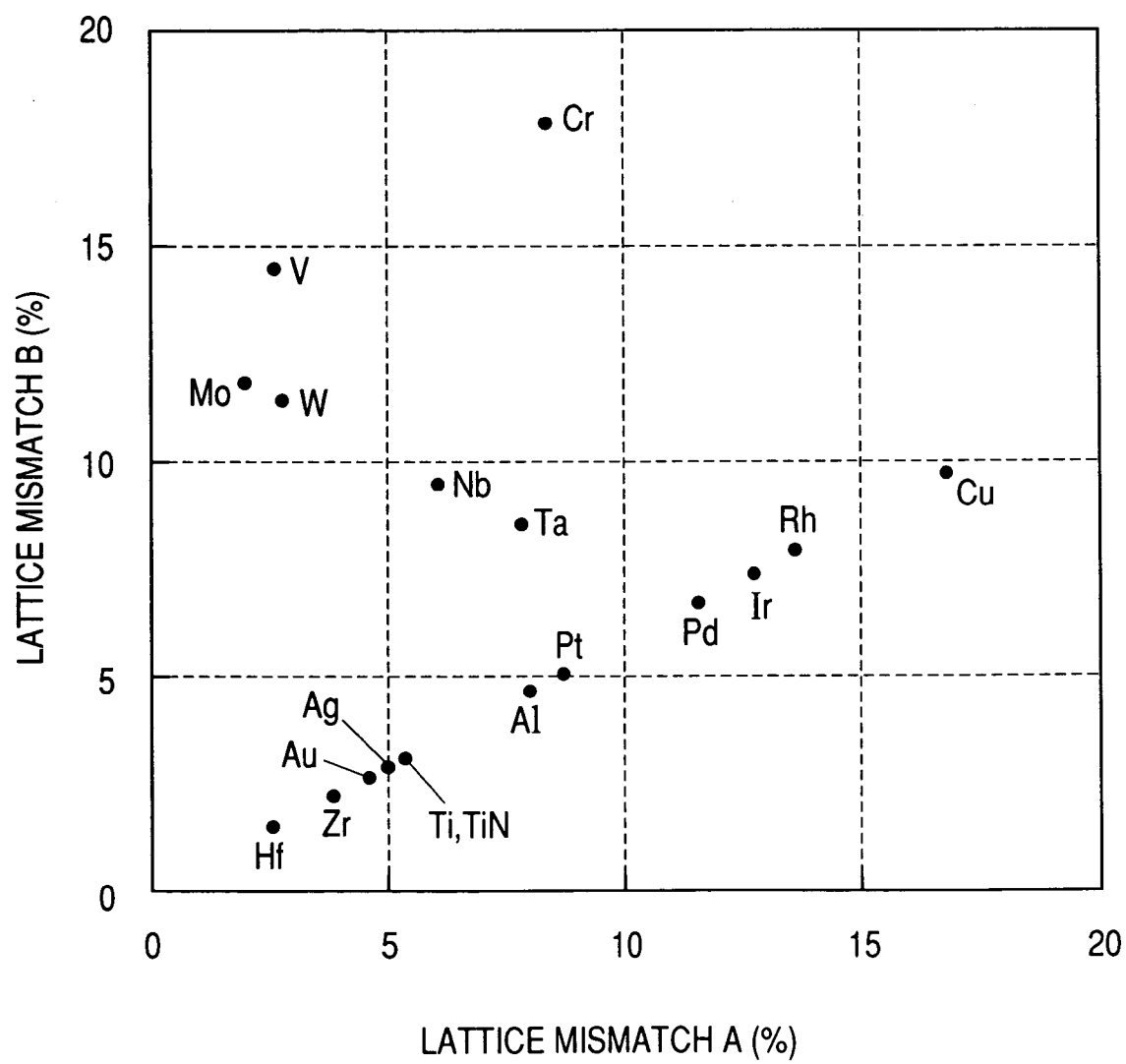
FIG. 2 is a drawing illustrating the crystal lattice mismatch between AlN and various metallic materials.

In the case when AlN is used for the piezoelectric layer 4, Ti, TiN, Au, Ag, Zr, or Hf is suitable for the interlayer 3, and W or Mo for the lower electrode layer 2. According to FIG. 2, since Ti, TiN, Au, Ag, Zr, or Hf has a lattice mismatch with respect to AlN of 7% or less in both the short edge direction and the long edge direction, the AlN piezoelectric layer can be formed highly oriented by using these materials for the interlayer. Moreover, since the elastic stiffness $C_{33}$ values of W and Mo are 300 GN/m² or more, a BAW resonator having a high Q value can be achieved by using W or Mo as the lower electrode layer 2. Compared to ZnO which is a typical material for other piezoelectric materials, AlN is superior from the viewpoint of elasticity and temperature characteristics. Therefore, a BAW resonator having a high Q value in which the resonance characteristics do not change with temperature can be obtained by using an AlN piezoelectric layer.

In addition to W and Mo, Cr, Ir, Pt, Ru, and an alloy thereof, etc. can be used as a material for the lower electrode layer 2. Attenuation of a BAW propagating the stack resonator 10 can be further decreased by forming the upper electrode layer 5 using a material which has a high value of the elastic stiffness $C_{33}$, the same as the lower electrode layer 2.

In this embodiment, in the case when W, Ti, AlN, and W are used for the lower electrode layer 2, the interlayer 3, the piezoelectric layer 4, and the upper electrode layer 5, respectively, the preferable film thicknesses are, for instance, 260 nm for the lower electrode layer 2, 20 nm for the inter layer 3, 870 nm for the piezoelectric layer 4, and 260 nm for the upper electrode layer, and the resonance frequency of the BAW resonator is about 2 GHz. Although W has excellent elasticity, it is a material which has a large lattice mismatch. However, the AlN piezoelectric layer subsequently stacked on the interlayer can be made highly oriented by forming on the lower electrode layer an interlayer composed of Ti which has a small lattice mismatch with respect to the AlN, and a BAW resonator having both an excellent Q value and excellent electromechanical energy conversion efficiency can be formed. As mentioned later, when W is used for the lower electrode layer and AlN is formed directly thereon as a piezoelectric layer, an AlN piezoelectric layer having excellent orientation cannot be obtained because of the lattice mismatch between both materials, resulting in making it difficult for excellent elasticity to be coexistent with a high orientation of the piezoelectric layer.

If the thickness t2 of the interlayer 3 on the substrate 1 is made sufficiently thin relative to the thickness t1 of the lower electrode layer 2, the effect of the elasticity of the material of the interlayer 3 on the Q value of the resonator can be made small. It is preferable that the film thickness of the interlayer 3 be 50 nm or less or 1/10 the film thickness of the lower electrode layer 2.

In FIG. 1, although the lower electrode layer 2 is formed on the substrate 1 so as to connect, an underlayer 100 may be inserted between the substrate 1 and the lower electrode layer 2. Inserting the underlayer brings about an effect of, for instance, reinforcing the support of the stack resonator, a stopper while forming the cavity 6 by etching, and improving the orientation of the lower electrode layer 2, etc. The material of the underlayer is preferably Al, AlN, silica ($SiO_2$), silicon nitride ($SiN_x$), and Ti, etc.

Moreover, in FIG. 1, although the interlayer 3 is formed over the whole top surface of the lower electrode layer 2, the interlayer 3 does not have to exist at the drawer section 37. The drawer section 37 is a part where signals propagating in the lower electrode layer 2 are taken out and signals are input to the lower electrode layer 2, but it is not intended to be limited by the structure shown in FIG. 1.

Second Embodiment

Figure 3:
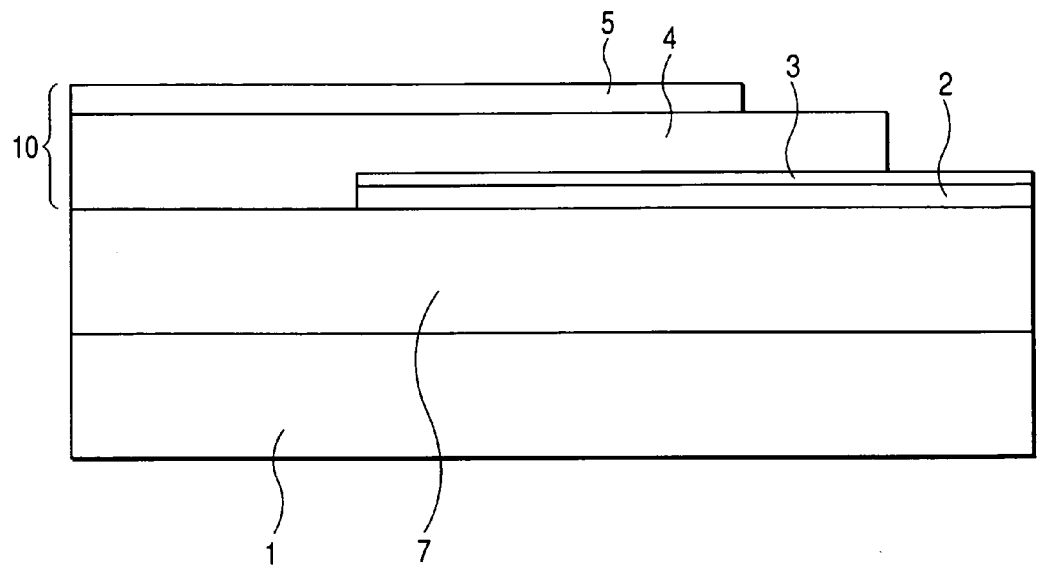
FIG. 3 is a cross-sectional structural drawing illustrating the second embodiment of a BAW resonator of the present invention.

FIG. 3 is a cross-sectional structural drawing illustrating another embodiment of a BAW resonator of the present invention. In FIG. 3, although the stack resonator 10 which includes the lower electrode layer 2, the interlayer 3, the piezoelectric layer 4, and the upper electrode layer 5 is the same as the first embodiment, in this embodiment, an acoustic isolation structure 7 is formed on the substrate 1 in lieu of providing the cavity 6 in the substrate 1. The stack resonator 10 is formed on the acoustic isolation structure 7.

The acoustic isolation structure 7 is formed for the purpose of preventing radiation of the acoustic energy which is generated by excitation of the piezoelectric layer 4 to the substrate 1. The acoustic isolation structure 7 is an acoustic reflector formed by periodically stacking more than two kinds of layers which have different acoustic impedances in a multilayer as one example. The acoustic reflector preferably uses W and Mo as a material for the high impedance layer, and $SiO_2$ as a material for the low impedance layer.

Figure 4:
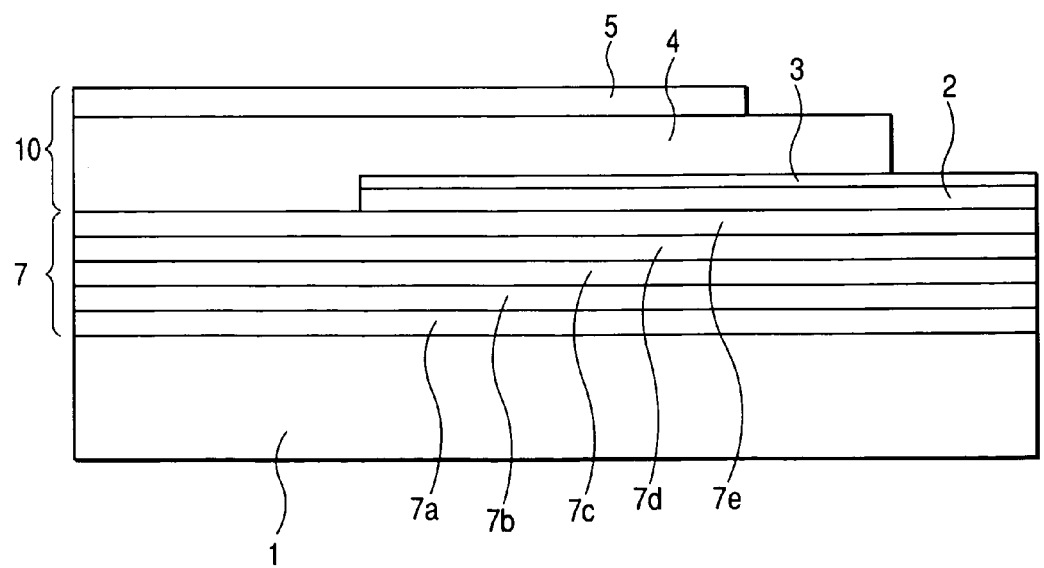
FIG. 4 is a cross-sectional structural drawing in a case when an acoustic reflector is applied to the second embodiment of a BAW resonator of the present invention.

FIG. 4 is an example of a case of using an acoustic reflector as a means of acoustic isolation. The acoustic isolation structure 7 is composed of layers 7a to 7e. The layers 7a, 7c, and 7e are composed of a low impedance material such as, for instance, $SiO_2$, and the layers 7b and 7d are composed of a high impedance material such as, for instance, W and Mo. Moreover, each of the film thicknesses of the layers 7a to 7e is controlled so as to correspond to ¼ of the wavelength of the BAW. Therein, the wavelength of the BAW can be uniquely determined by the density and the elastic constant of the material, and the resonance frequency. Although, in the BAW resonator in FIG. 4, the BAW generated by excitation of the piezoelectric layer propagates in the depth direction in the acoustic reflector, a part of the BAW is reflected and a part of it is transmitted and propagates when it is incident in the interface between the low impedance layer and the high impedance layer. The greater the difference of the acoustic impedance of the adjacent layers, the higher is the reflectivity of the BAW. Moreover, since the film thickness of the layers 7a to 7e correspond to ¼ wavelength of the BAW, the BAW reflected at the interface of each layer is intensified by each other and returned to the piezoelectric layer. Therefore, an energy containment structure of the BAW resonator can be achieved by the acoustic reflector. Although the acoustic reflector in FIG. 4 consists of five layers, the suitable number of layers is different depending on the reflectivity needed and the material constant of each material, etc. Moreover, the material constituting one acoustic reflector is not limited by two kinds, and a material with three kinds or more may be included. Furthermore, an extremely thin layer may be inserted between each layer which has the film thickness of ¼ wavelength for the purpose of the etch stopper layer and the buffer layer, etc. Moreover, an underlayer may be inserted between the acoustic isolation structure 7 and the lower electrode layer 2, the same as the first embodiment.

Figure 5A:
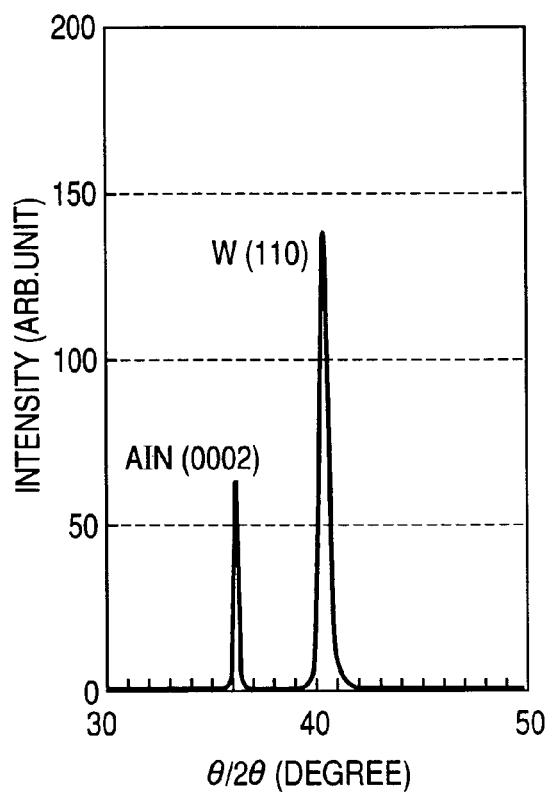
FIG. 5A is an experimental result which shows the effect of an interlayer on the orientation of an AlN piezoelectric layer.
Figure 5B:
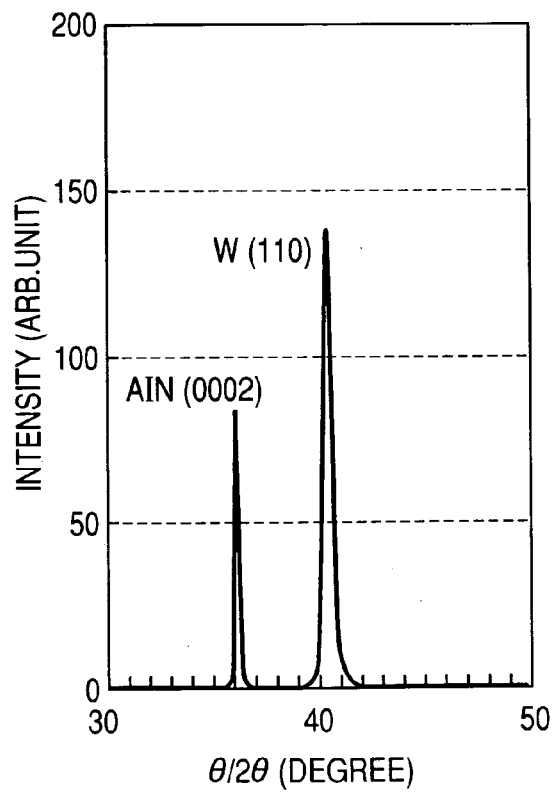
FIG. 5B is an experimental result which shows the effect of an interlayer on the orientation of an AlN piezoelectric layer.

FIG. 5 are experimental results which show the effect of an interlayer on the orientation of the piezoelectric layer. FIG. 5A is an X-ray diffraction pattern of an experimental sample in which an AlN thin film with a film thickness of about 500 nm is deposited on a W thin film with a film thickness of about 250 nm, and FIG. 5B is an X-ray diffraction pattern of an experimental sample in which a Ti thin film with a film thickness of about 10 nm is deposited on a W thin film with a film thickness of about 250 nm, and an AlN thin film with a film thickness of about 500 nm is deposited thereon. In these experimental samples, the deposition conditions of W and AlN are identical.

Since the diffraction peak intensities of W are almost the same in FIGS. 5A and 5B, it can be understood that the orientations of W are the same. Nevertheless, in FIG. 5B where the interlayer is applied, the diffraction peak intensity of AlN increases by 30% or more compared with FIG. 4A where the interlayer is not applied.

According to this experimental result, it is shown that the orientation of the AlN piezoelectric layer can be improved by inserting an interlayer composed of an appropriate material.

Figure 6A:
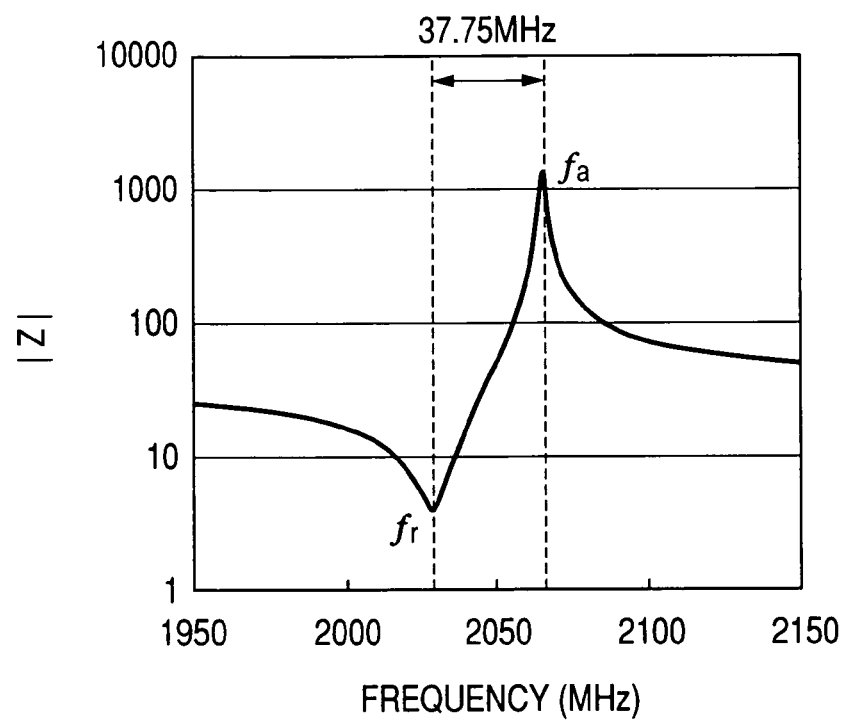
FIG. 6A is an experimental result which shows the effect of an interlayer on the electrical characteristics of a BAW resonator.
Figure 6B:
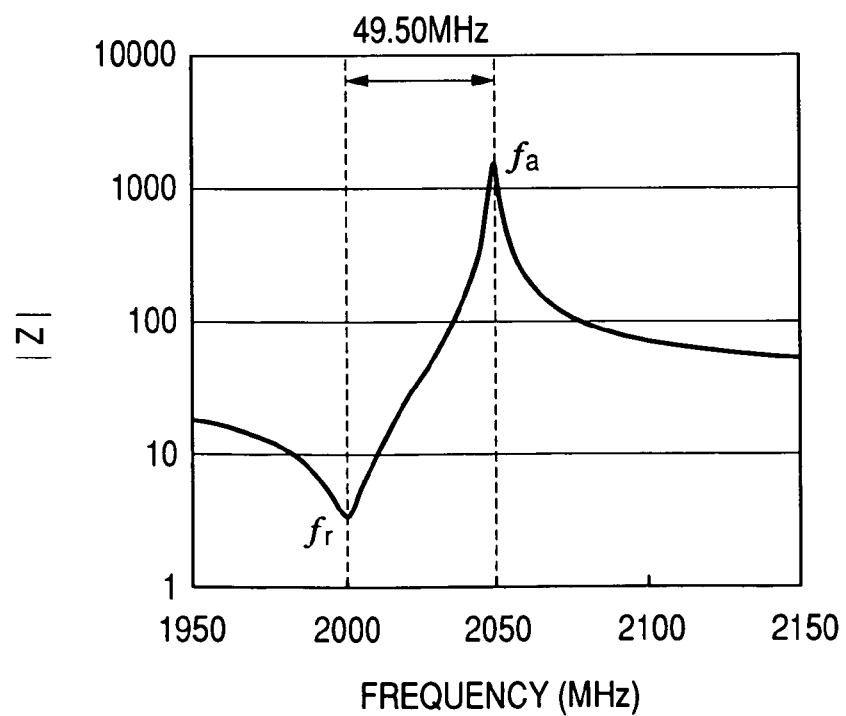
FIG. 6B is an experimental result which shows the effect of an interlayer on the electrical characteristics of a BAW resonator.

Moreover, FIG. 6 are experimental results which show the effect of an interlayer on the electrical characteristics of a BAW resonator. FIG. 6A is the actual measurement value of the impedance characteristics of a BAW resonator in which W is applied to the lower electrode layer and the upper electrode layer and AlN is applied to the piezoelectric layer. Moreover, FIG. 6B is the actual measurement value of the impedance characteristics of a BAW resonator in which W is applied to the lower electrode layer and the upper electrode layer, AlN to the piezoelectric layer, and Ti to the interlayer. The difference between the resonance frequency ($f_r$) and the anti-resonance frequency ($f_a$), which correspond to the maximum band width of the filter consists of the BAW resonator, is 37.75 MHz in FIG. 5A where the interlayer is not applied and 49.50 MHz in FIG. 5B where the interlayer is applied. When the $k^2$ which indicates the electromechanical energy conversion efficiency of the BAW resonator is calculated by using equation 1, FIG. 5A, where the interlayer is not applied, shows a value of 4.42% and FIG. 5B, where the interlayer is applied, shows 5.81%.

According to the experimental results mentioned above, even in the case when the lower electrode layer is formed of a material having a large lattice mismatch with an AlN piezoelectric layer, if an interlayer with a relatively extreme thin film thickness which is composed of an appropriate material is inserted between the lower electrode layer and the AlN piezoelectric layer, a highly oriented AlN piezoelectric layer can be obtained. As a result, it is shown that a high performance BAW resonator can be fabricated.

It is preferable that the process for depositing the lower electrode 2 and the process for depositing the interlayer 3 be carried out continuously in vacuum and that air exposure not be carried out midstream in the fabrication process of a BAW resonator of the present invention. Moreover, in one example, the deposition technique of the underlayer, the lower electrode layer 2, the interlayer 3, the piezoelectric layer 4, and the upper electrode layer 5 is at least either a sputtering technique or a chemical vapor deposition technique.

Third Embodiment

Figure 9:
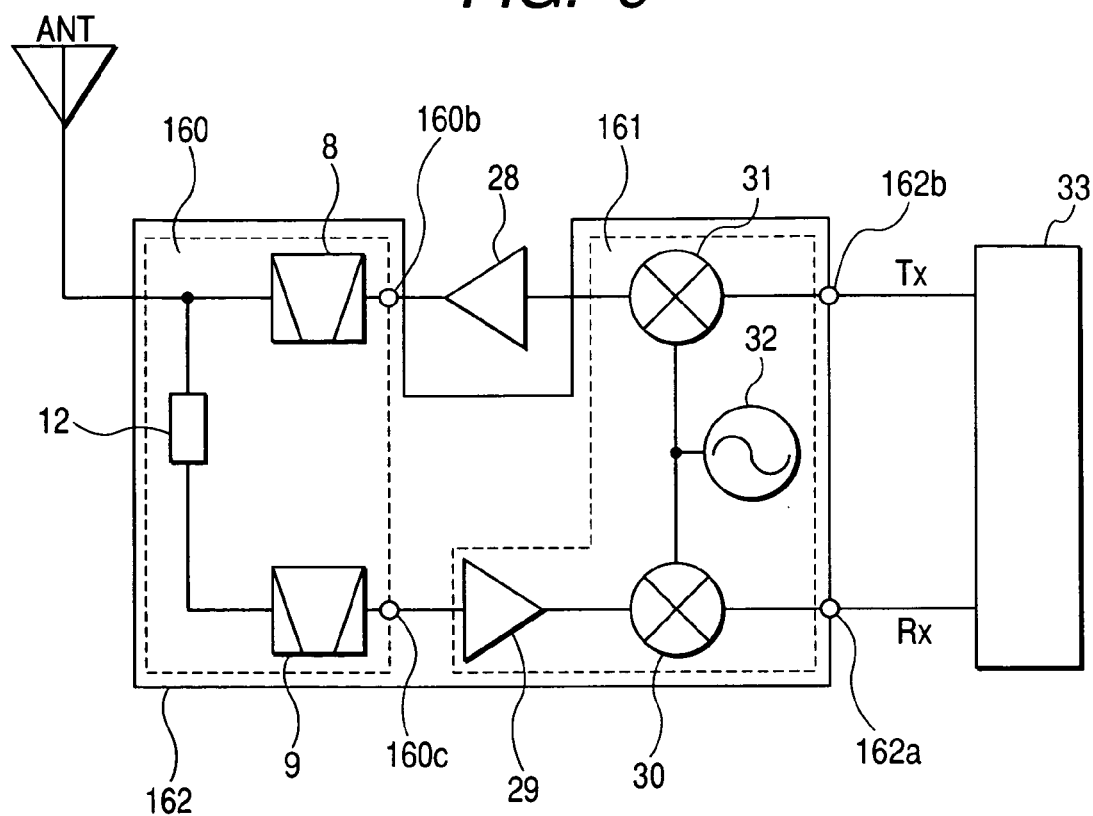
FIG. 9 is a block diagram of a circuit including a front end section in a typical portable phone.

Herein, an embodiment in which a filter using a BAW resonator of the present invention is fabricated on a single substrate will be explained. In order to fabricate a BAW resonator filter, it is necessary to electrically connect more than two BAW resonators which have different resonance frequencies. Basically, although two kinds of resonance frequencies are enough, three or more resonators having different resonance frequencies from each other may be required. FIG. 9 is a block circuit diagram illustrating an example of a portable phone to which a filter using a BAW resonator of the present invention is applied. A concrete configuration of a filter will be described later.

In FIG. 9, the reference code 12 indicates a phase shifter and this phase shifter 12 makes it possible to share an antenna with a receiving section and a transmission section. A high frequency received signal Rx received at the antenna ANT passes the phase shifter 12 and is input to a low noise amplifier 29 through the receiver filter 9 which removes an image frequency signal and passes selectively only a frequency signal of a predetermined receiver band. The high frequency received signal Rx amplified at the low noise amplifier 29 is transmitted to a base band section 33 portable phone internal circuit through a receiver mixer circuit 30 and an intermediate frequency filter which is not shown in the figure, etc.

On the other hand, the transmission signal Tx transmitted from the base band section 33 is input to a power amplifier 28 through a transmission mixer 31. The transmission signal Tx amplified by the power amplifier 28 is irradiated as electric waves from the antenna ANT through the transmission filter 8 which selectively passes the transmission signal of a predetermined transmission band. In the block circuit diagram shown in FIG. 9, a front end section 160 consists of the receiver filter 9, the transmission filter 8, and the phase shifter 12.

Figure 7:
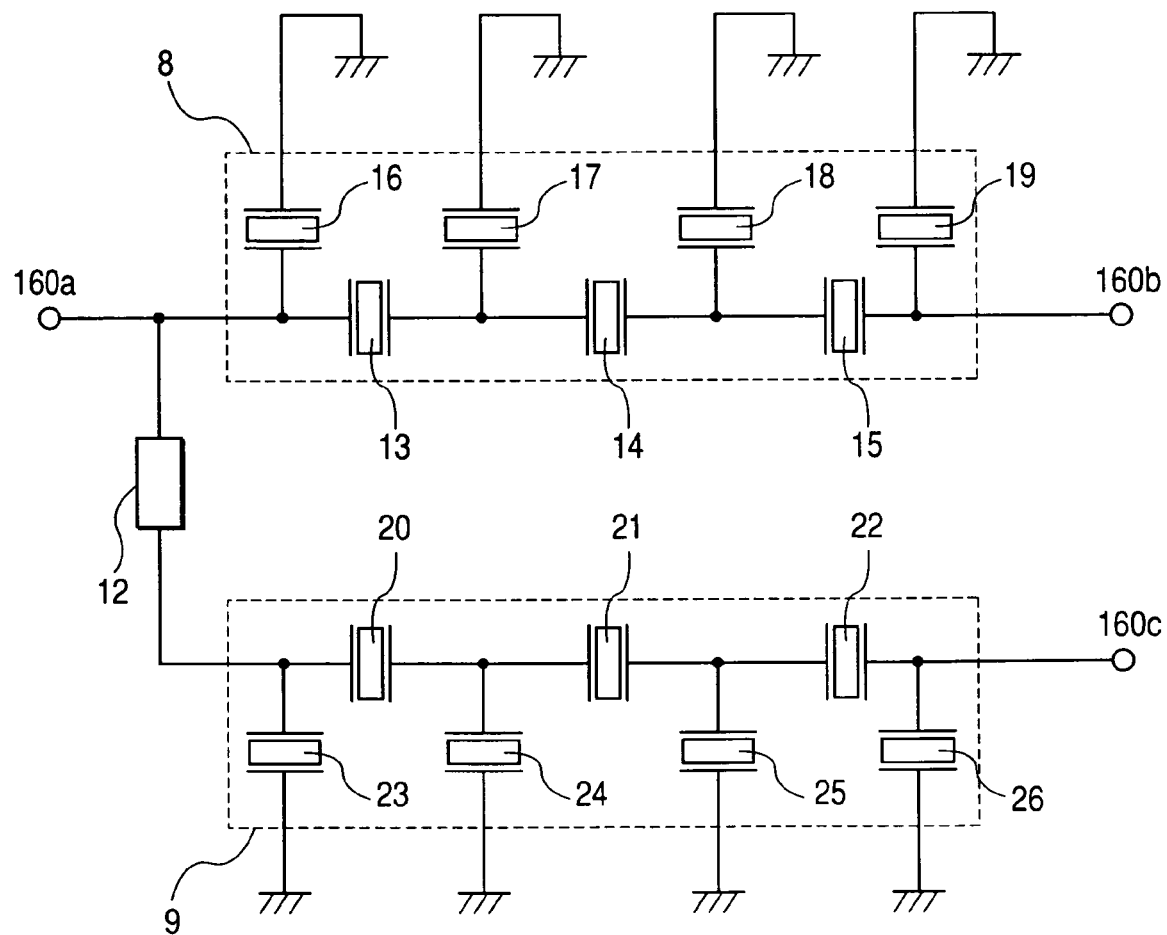
FIG. 7 is a circuit block diagram illustrating transmission filter and receiver filter sections in which a front end section shown in FIG. 9 consists of an array of BAW resonators.

FIG. 7 is a circuit block diagram illustrating one example of the front end section 160 shown in FIG. 9. In FIG. 7, the transmission filter 8 and the receiver filter 9 each consists of a plurality of sets of BAW resonators of the present invention. The transmission filter 8 and the receiver filter 9 consist of an array of BAW resonators 13 to 19 surrounded by a broken line and an array of BAW resonators 20 to 26 surrounded by a broken line, respectively.

The transmission signal is input from a terminal 160b which is connected to the BAW resonators 15 and 19 constituting the transmission filter 8 and output from a terminal 160a which is connected to the BAW resonators 13 and 16. On the other hand, the received signal from the antenna passes the phase shifter 12, is input to the BAW resonators 20 and 23 constituting the receive filter 9, and is output from a terminal 160c connected to the BAW resonators 22 and 26. In the transmission filter 8, the BAW resonators 13 to 15 constitute a series resonator and the BAW resonators 16 to 19 constitute a shunt resonator. In the receive filter 9, the BAW resonators 20 to 22 constitute a series resonator and the BAW resonators 23 to 26 constitute a shunt resonator.

The array of resonators shown here is one example and it is not intended to be limited to the array shown in the embodiment because the array of resonators is determined by the desired filter characteristics. Moreover, the circuit used for the phase shifter 12 only has to be a well-know configuration, for instance, it consists of an inductor and a conductor or a λ/4 transmission line.

Figure 8:
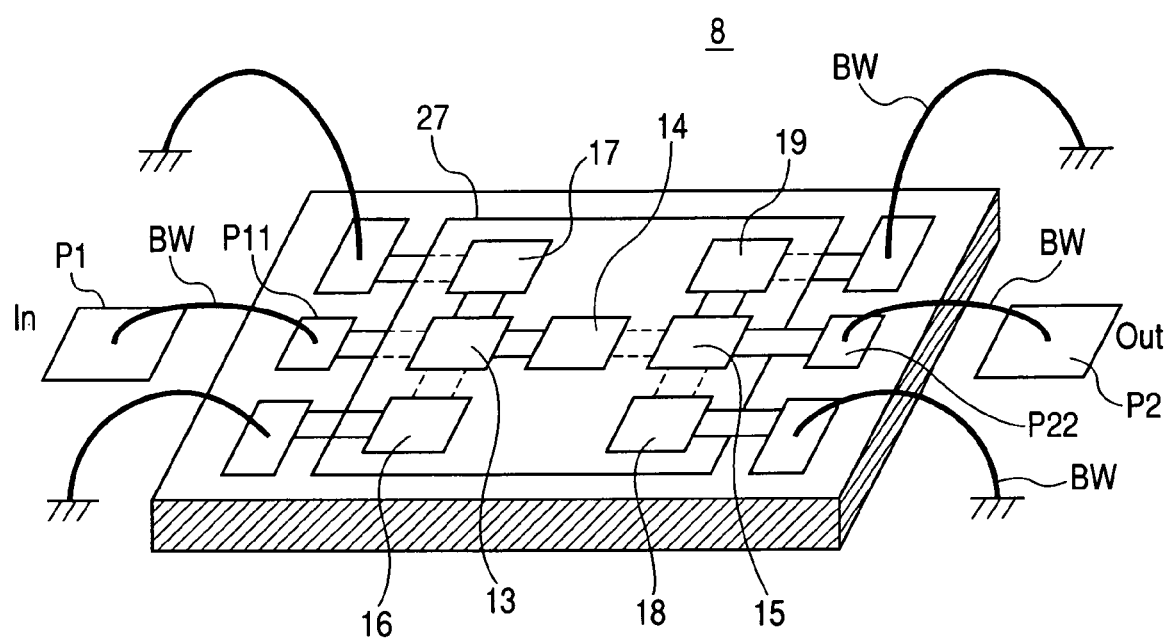
FIG. 8 is a schematic perspective illustration when a transmission filter consisting of BAW resonators of the present invention is fabricated on a single substrate.

FIG. 8 is a schematic perspective illustration when the transmission filter 8 shown in FIG. 7 is fabricated on a single substrate. A BAW resonator which has a configuration such as that shown in the aforementioned embodiments 1 and 2 is used for the BAW resonators 13 to 19. Herein, although the BAW resonators 13 to 19 are shown as quadrilaterals, it is not limited to a quadrilateral because the shape of the BAW resonator is determined by the desired filter characteristics. The BAW resonators 13 to 15 constitute a series resonator and the BAW resonators 16 to 19 constitute a shunt resonator. In FIG. 8, the full line connecting the BAW resonators indicates the circuit connected to the upper electrode layer of the BAW resonator and the dotted line indicates the circuit connected to the lower electrode layer of the BAW resonator. The quardrilateral region 27 is a piezoelectric layer. Moreover, the reference code P1 is an input circuit pad to which the transmission signal is transmitted from the internal circuit not shown in the figure, is connected by means of a bonding wire BW to an input pad P11 of the filter which is connected to the BAW resonator 13 of the transmission filter 8, and, additionally, is connected to an output pad P22 of the filter through the BAW resonators 72 and 73 which is connected in series by an electrode circuit. The output pad P22 of the filter and the pad P2 connected to the antenna which is not shown in figure is connected by the bonding wire BW. The circuit pad connected to the upper electrode layer of the BAW resonators 16 and 18 and the circuit pad connected to the lower electrode layer of the BAW resonators 17 and 19 are connected independently by the bonding wire BW to the ground pad which is not shown in the figure. Thus, the transmission filter 8 shown in the circuit drawing of FIG. 7 is formed on a single substrate.

When a filter consists of BAW resonators, the Q value is related to the insertion loss of the filter. Moreover, $k^2$ is related to the frequency passband width of the filter. That is, in this embodiment, since a BAW resonator of the present invention is used for the BAW resonator constituting the filter, low energy consumption of the filter can be achieved, and application to a wireless communication system with a wide communication band is enabled.

The embodiment shown in FIG. 8 is a case when the bonding wire BW is used to make a connection between the internal circuit which is not shown in the figure and the transmission filter 8. However, another packaging method such as bump bonding, etc. may be applied. Moreover, the input terminal P22 and the output terminal P11 only have to connect to either the upper or lower electrode of the piezoelectric bulk resonator, and it is not limited to one in which it is connected to the upper electrode such as that shown in this embodiment.

In this embodiment, although the case when the transmission filter 8 is formed on a single substrate was explained, the receiver filter 9 is also formed on a single substrate. Moreover, it is also possible that the transmission filter 8 and receiver filter 9 or a front end section 160 including the transmission filter 8 and receiver filter 9 are formed on a single substrate. In this case, a further down-sizing and cost reduction of the front end section and portable phones mounting thereof is made possible, and furthermore, in the future, it becomes possible to be easily applied to integration with an RF-IC.

Fourth Embodiment

An embodiment of an RF module using a BAW resonator of the present invention will be explained. This embodiment is one in which the front end section 160, the RF-IC section 161, and the power amplifier 28 are modularized as a chipset for a portable phone. Only the front end section 160 may be modularized, and, in this case, it is connected to the RF-IC section 161 and the power amplifier 28 through the terminals 160a and 160b. Moreover, both the front end section 160 and the RF-IC section 161 may be modularized, and, in this case, the RF module 162 is connected to the base band section 33 through the terminals 162a and 162b.

Since a filter using a BAW filter of the present invention is used in this embodiment, an RF module which is applicable to a wireless communication system with a wide communication band can be provided. Moreover, down-sizing and cost reduction of a portable phone incorporating it is made possible by modularizing the functions of the signal transmission-receiving system.

Fifth Embodiment

Figure 10:
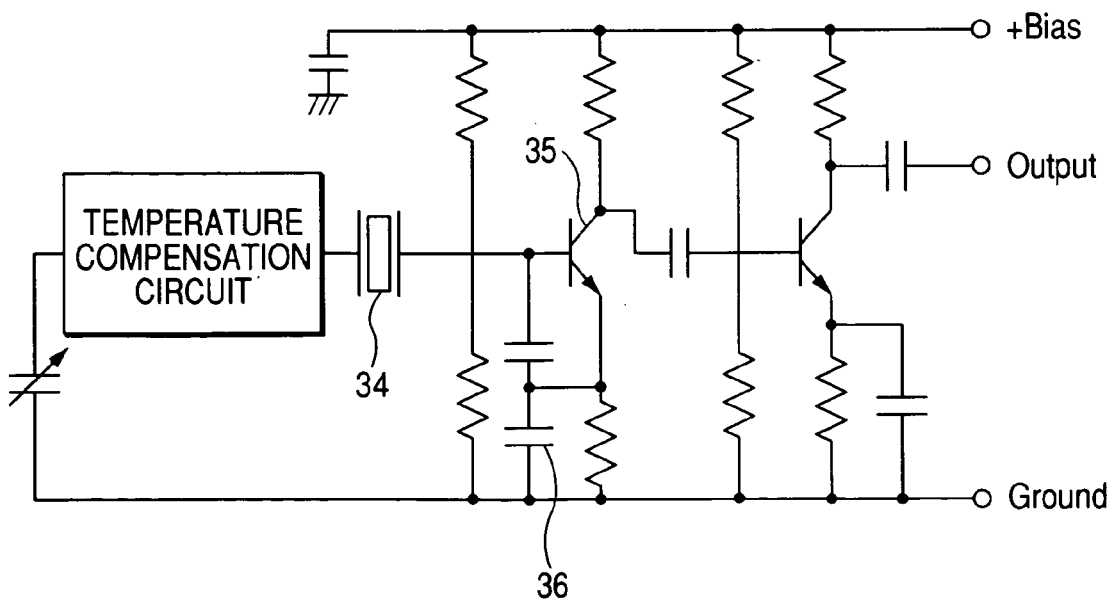
FIG. 10 is a Colpitts oscillator in which a BAW resonator of the present invention is used for a resonator section.
Figure 11:
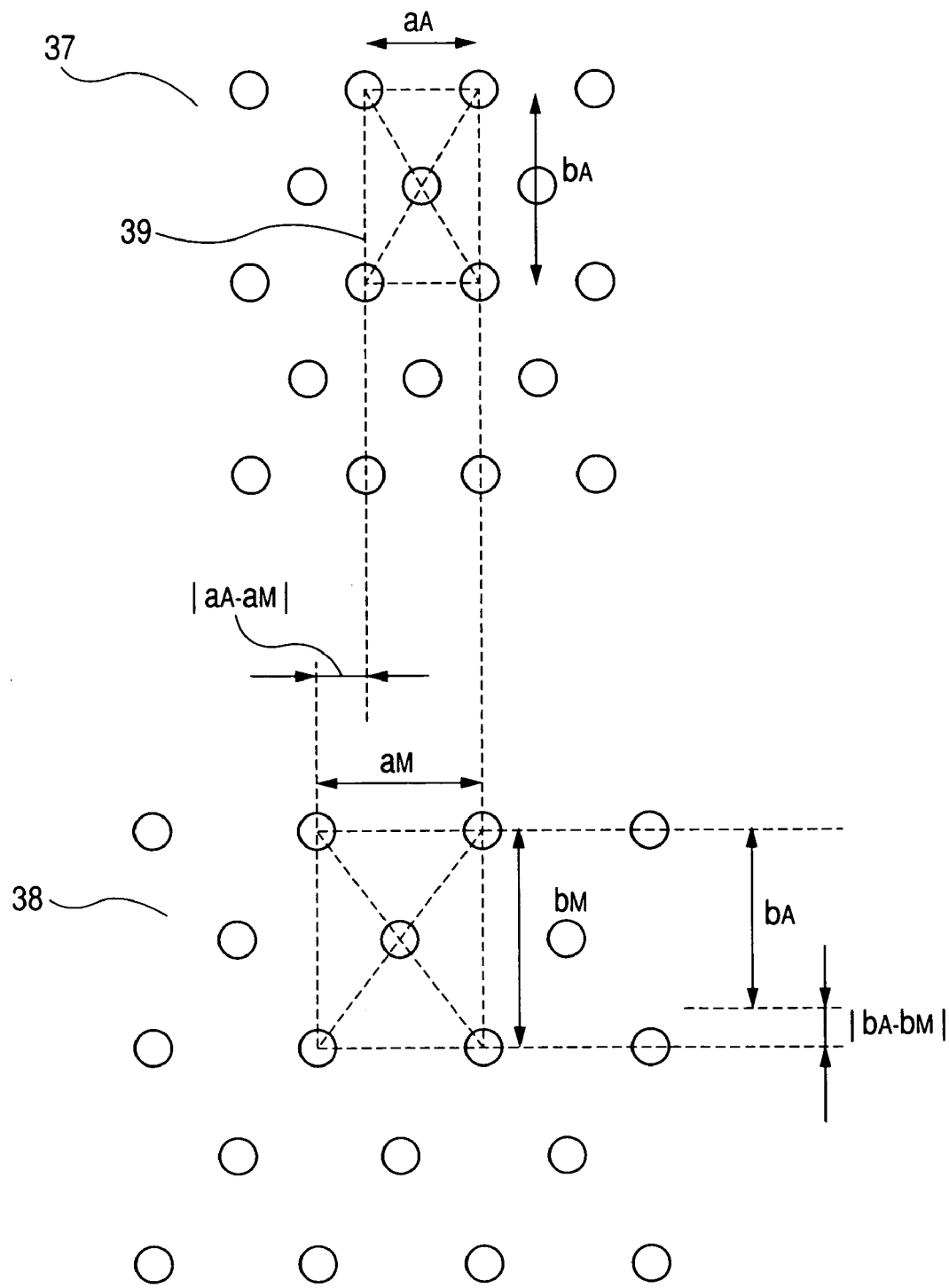
FIG. 11 is a schematic drawing which shows lattice arrays of AlN and various metals in a closest packed plane.
Figure 12:
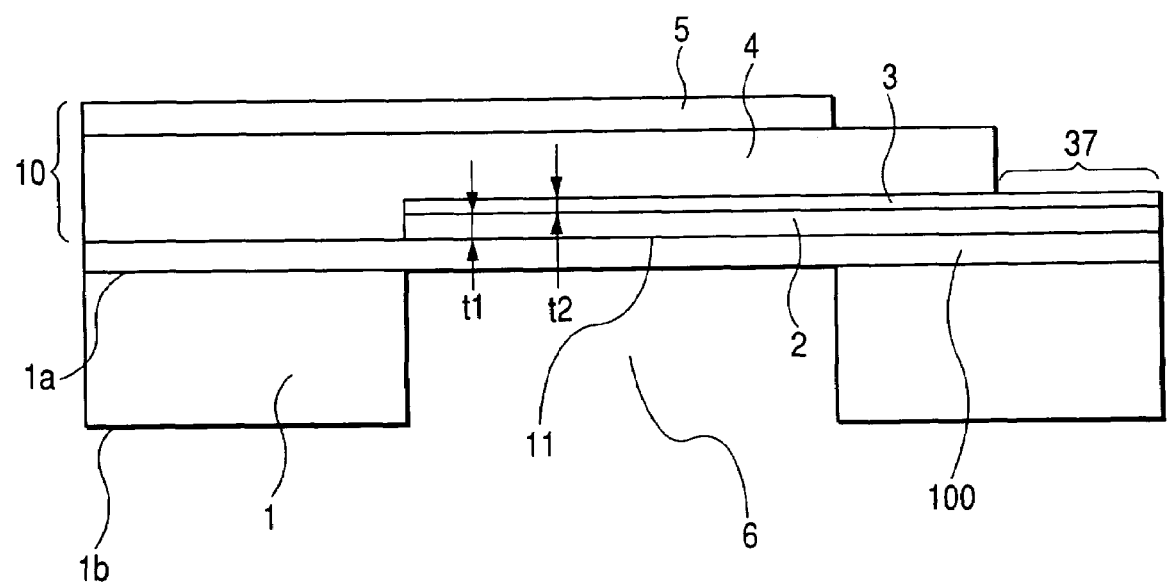
FIG. 12 is a cross-sectional schematic drawing illustrating the first embodiment of a BAW resonator of the present invention when an underlayer is further formed.

FIG. 10 is one example illustrating a case when a standard frequency oscillator is constructed using a BAW of the present invention. An oscillator having a resonance frequency from several megahertz to several tens of megahertz can be constructed using a vibration mode in accordance with the waves which propagate in a direction perpendicular to the direction of the electric filed. FIG. 10 is a Colpitts oscillator in which a BAW resonator of the present invention is used for a resonator section. The BAW resonator 34 is connected to the gate of the amplifier stage transistor 35, and feedback is to the input of the amplifier stage transistor 35. Moreover, a capacitative element 36 in which another terminal is grounded is connected to the input of the amplifier stage transistor. Performance equivalent to that of a conventional temperature compensated crystal oscillator can be achieved in a small size and with a monolithic by using the BAW resonator.

As mentioned above, the third to fifth embodiments explain a filter and a standard frequency oscillator at the front end section for use in a portable phone, as a typical example. However, the present invention is not intended to be limited to these embodiments, and a BAW resonator of the present invention is also applicable to an RF filter in mobile communication systems, notably a wireless LAN and a wireless IC tag, etc. Moreover, it also can be applied to a standard frequency oscillator which is used for electronic equipment such as a portable phone, a personal computer, and a digital camera, etc., resulting in further down-sizing being achieved.

What is claimed is:

1. A bulk acoustic wave resonator comprising:
a substrate;
a first electrode layer formed over one face of said substrate;
a first layer formed over said first electrode layer;
a piezoelectric layer formed over said first layer; and
a second electrode layer formed over said piezoelectric layer;
wherein both the first lattice mismatch, which is determined between a short edge of the lattice constituting a closest packed plane of a material consisting of said first layer and a short edge of the lattice constituting a closest packed plane of a material consisting of said piezoelectric layer, and the second lattice mismatch, which is determined between a long edge of the lattice constituting a closest packed plane of a material consisting of said first layer and a long edge of the lattice constituting a closest packed plane of a material consisting of said piezoelectric layer, are 7% or less;
wherein a value of the elastic stiffness $C_{33}$ of a material constituting said first electrode layer is 300 GN/m$^2$ or more;
wherein a lower surface of said first layer is in contact with an upper surface of said first electrode layer;
wherein a lower surface of said piezoelectric layer is in contact with an upper surface of said first layer;
wherein a thickness of said first layer is no greater 50 nm; and
wherein the thickness of said first layer is thinner than a thickness of said first electrode layer.

2. The bulk acoustic wave resonator according to claim 1, wherein said piezoelectric layer includes aluminum nitride, and
wherein said first layer includes at least one element selected from a group of titanium, titanium nitride, gold, silver, zirconium, and hafnium.

3. The bulk acoustic wave resonator according to claim 2, wherein said first electrode layer includes at least one of tungsten and molybdenum.

4. The bulk acoustic wave resonator according to claim 1, wherein a second layer having an acoustic isolation structure is provided between said substrate and said first electrode layer.

5. The bulk acoustic wave resonator according to claim 4, wherein said acoustic isolation structure is an acoustic reflector formed by periodically stacking more than two kinds of layers where the acoustic impedance is different.

6. The bulk acoustic wave resonator according to claim 1, wherein said substrate has a cavity having an opening which is open at said one face, and
wherein said first electrode layer has a part overlapping said opening.

7. A bulk acoustic wave resonator comprising:
a substrate;
a first electrode layer formed over one face of said substrate;
a first layer formed over said first electrode layer;
a piezoelectric layer formed over said first layer; and
a second electrode layer formed over said piezoelectric layer;
wherein both the first lattice mismatch, which is determined between a short edge of the lattice constituting a closest packed plane of a material consisting of said first layer and a short edge of the lattice constituting a closest packed plane of a material consisting of said piezoelectric layer, and the second lattice mismatch, which is determined between a long edge of the lattice constituting a closest packed plane of a material consisting of said first layer and a long edge of the lattice constituting a closest packed plane of a material consisting of said piezoelectric layer, are 7% or less;

wherein a value of the elastic stiffness $C_{33}$ of a material constituting said first electrode layer is 300 GN/m$^2$ or more;

wherein a lower surface of said first layer is in contact with an upper surface of said first electrode layer;

wherein a lower surface of said piezoelectric layer is in contact with an upper surface of said first layer;

wherein a thickness of said first layer is no greater 50 nm;

wherein said substrate has a cavity having an opening which is open at said one face;

wherein said first electrode layer has a part overlapping said opening; and wherein a second layer is provided between said substrate and said first electrode layer.

8. A bulk acoustic wave resonator filter which has a plurality of bulk acoustic wave resonators formed over a single substrate and both an input terminal and an output terminal which are mutually connected through said plurality of bulk acoustic wave resonators;

wherein at least one of said plurality of bulk acoustic wave resonators comprises:

a first electrode layer formed over one face of said substrate;

a first layer formed over said first electrode layer;

a piezoelectric layer formed over said first layer; and a second electrode layer formed over said piezoelectric layer;

wherein both the first lattice mismatch, which is determined between a short edge of the lattice constituting a closest packed plane of a material consisting of said first layer and a short edge of the lattice constituting a closest packed plane of a material consisting of said piezoelectric layer, and the second lattice mismatch, which is determined between a long edge of the lattice constituting a closest packed plane of a material consisting of said first layer and a long edge of the lattice constituting a closest packed plane of a material consisting of said piezoelectric layer are 7% or less;

wherein a value of the elastic stiffness $C_{33}$ of a material constituting said first electrode layer, is 300 GN/m$^2$ or more;

wherein a lower surface of said first layer is in contact with an upper surface of said first electrode layer;

wherein a lower surface of said piezoelectric layer is in contact with an upper surface of said first layer;

wherein a thickness of said first layer is no greater than 50 nm; and wherein the thickness of said first layer is thinner than a thickness of said first electrode layer.

9. The bulk acoustic wave resonator filter according to claim 8, wherein said piezoelectric layer includes aluminum nitride, and wherein said first layer includes at least one element selected from a group of titanium, titanium nitride, gold, silver, zirconium, and hafnium.

10. The bulk acoustic wave resonator filter according to claim 9, wherein said first electrode layer includes at least one of tungsten and molybdenum.

11. The bulk acoustic wave resonator filter according to claim 8, wherein a second layer having an acoustic isolation structure is provided between said substrate and said first electrode layer.

12. The bulk acoustic wave resonator filter according to claim 11, wherein said acoustic isolation structure is an acoustic reflector formed by periodically stacking more than two kinds of layers where the acoustic impedance is different.

13. The bulk acoustic wave resonator filter according to claim 8, wherein said a plurality of bulk acoustic wave resonators include a plurality of piezoelectric bulk resonators constituting a serial resonator, and a plurality of piezoelectric bulk resonators constituting a parallel resonator.

14. The bulk acoustic wave resonator filter according to claim 8, wherein said substrate has a cavity having an opening which is open at said one face, and wherein said first electrode layer has a part overlapping said opening.

15. A bulk acoustic wave resonator filter which has a plurality of bulk acoustic wave resonators formed over a single substrate and both an input terminal and an output terminal which are mutually connected through said plurality of bulk acoustic wave resonators;

wherein at least one of said plurality of bulk acoustic wave resonators comprises:

a first electrode layer formed over one face of said substrate;

a first layer formed over said first electrode layer;

a piezoelectric layer formed over said first layer; and a second electrode layer formed over said piezoelectric layer;

wherein both the first lattice mismatch, which is determined between a short edge of the lattice constituting a closest packed plane of a material consisting of said first layer and a short edge of the lattice constituting a closest packed plane of a material consisting of said piezoelectric layer, and the second lattice mismatch, which is determined between a long edge of the lattice constituting a closest packed plane of a material consisting of said first layer and a long edge of the lattice constituting a closest packed plane of a material consisting of said piezoelectric layer are 7% or less;

wherein a value of the elastic stiffness $C_{33}$ of a material constituting said first electrode layer, is 300 GN/m$^2$ or more;

wherein a lower surface of said first layer is in contact with an upper surface of said first electrode layer;

wherein a lower surface of said piezoelectric layer is in contact with an upper surface of said first layer;

wherein a thickness of said first layer is no greater than 50 nm;

wherein said substrate has a cavity having an opening which is open at said one face;

wherein said first electrode layer has a part overlapping said opening; and wherein a second layer is provided between said substrate and said first electrode layer.

* * * * *